(12) United States Patent
Hart

(10) Patent No.: US 10,937,752 B1
(45) Date of Patent: Mar. 2, 2021

(54) LEAD FREE SOLDER COLUMNS AND METHODS FOR MAKING SAME

(71) Applicant: TopLine Corporation, Irvine, CA (US)

(72) Inventor: Martin B. Hart, Irvine, CA (US)

(73) Assignee: TopLine Corporation, Irvine, CA (US)

( * ) Notice: Subject to any disclaimer, the term of this patent is extended or adjusted under 35 U.S.C. 154(b) by 0 days.

(21) Appl. No.: 16/983,983

(22) Filed: Aug. 3, 2020

(51) Int. Cl.
*H01L 23/00* (2006.01)
*B23K 35/26* (2006.01)
(Continued)

(52) U.S. Cl.
CPC .......... *H01L 24/13* (2013.01); *B23K 35/0227* (2013.01); *B23K 35/262* (2013.01); *C22C 13/00* (2013.01); *B23K 2101/38* (2018.08); *B23K 2101/40* (2018.08); *B23K 2101/42* (2018.08); *H01L 2224/13017* (2013.01); *H01L 2224/13076* (2013.01); *H01L 2224/13111* (2013.01); *H01L 2224/13139* (2013.01); *H01L 2224/13144* (2013.01); *H01L 2224/13147* (2013.01); *H01L 2224/13163* (2013.01); *H01L 2224/13164* (2013.01); *H01L 2224/13169* (2013.01); *H01L 2224/13209* (2013.01); *H01L 2224/13211* (2013.01); *H01L 2224/13213* (2013.01); *H01L 2224/13216* (2013.01); *H01L 2224/13239* (2013.01); *H01L 2224/13247* (2013.01);
(Continued)

(58) Field of Classification Search
CPC .......... H01L 24/12; H01L 2224/10125; H01L 2224/1112; H01L 2224/10155; H01L 2224/13013; H01L 2224/13078; H01L 2224/13541; H01L 2224/1355; H01L 2224/13551; H01L 2224/13561; H05K 2203/0405; H05K 2203/0435; H05K 2203/0465; B23K 2101/38; B23K 2101/40; B23K 2101/42
See application file for complete search history.

(56) References Cited

U.S. PATENT DOCUMENTS 2,759,166 A * 8/1956 Mallina .................... H01R 4/14
  174/94 R
3,921,285 A   11/1975 Krall
(Continued)

FOREIGN PATENT DOCUMENTS

GB        2142568        1/1985

*Primary Examiner* — David A Zarneke
(74) *Attorney, Agent, or Firm* — Knobbe, Martens, Olson & Bear, LLP

(57) ABSTRACT

Disclosed herein are embodiments of lead-free (Pb-free) or lead-bearing solder column devices that can include an inner core, an outer sleeve surrounding a portion of the inner core, at least one space along a length of the outer sleeve, and a second layer including a solder material coupled with a portion of the inner core within the at least one space. The inner core can be configured to support the solder column so as to prevent a collapse of the solder column at temperatures above a liquidus temperature of the outer sleeve's solder material and the second layer's solder material. The column serves as a heat-sink to conduct excessive heat away from a heat generating semiconductor chip. Moreover, the compliant solder column absorbs strain and mechanical stress caused by a difference in the coefficient of thermal expansion (CTE) connecting the semiconductor chip to a printed circuit board (PCB).

20 Claims, 10 Drawing Sheets

(51) Int. Cl.
*C22C 13/00* (2006.01)
*B23K 35/02* (2006.01)
*B23K 101/40* (2006.01)
*B23K 101/38* (2006.01)
*B23K 101/42* (2006.01)

(52) U.S. Cl.
CPC ......... *H01L 2224/13255* (2013.01); *H01L 2224/13263* (2013.01); *H01L 2924/01004* (2013.01); *H01L 2924/014* (2013.01); *H01L 2924/0105* (2013.01); *H01L 2924/01028* (2013.01); *H01L 2924/01029* (2013.01); *H01L 2924/01032* (2013.01); *H01L 2924/01046* (2013.01); *H01L 2924/01047* (2013.01); *H01L 2924/01049* (2013.01); *H01L 2924/01078* (2013.01); *H01L 2924/01079* (2013.01); *H01L 2924/01082* (2013.01); *H01L 2924/01083* (2013.01); *H01L 2924/351* (2013.01); *H05K 2203/0405* (2013.01); *H05K 2203/0435* (2013.01); *H05K 2203/0465* (2013.01)

(56) References Cited

U.S. PATENT DOCUMENTS

| 4,541,681 | A  | * | 9/1985  | Dorman        | H01R 13/17   |
|           |    |   |         |               | 439/245      |
| 4,705,205 | A  | * | 11/1987 | Allen         | H05K 13/0465 |
|           |    |   |         |               | 228/180.22   |
| 5,328,660 | A  |   | 7/1994  | Gonya et al.  |              |
| 6,287,126 | B1 | * | 9/2001  | Berger        | H01R 4/64    |
|           |    |   |         |               | 439/65       |
| 6,313,523 | B1 | * | 11/2001 | Morris        | H01L 24/72   |
|           |    |   |         |               | 257/690      |
| 6,429,388 | B1 |   | 8/2002  | Interrante et al. |          |
| 6,659,778 | B2 | * | 12/2003 | Li            | H01R 13/2407 |
|           |    |   |         |               | 439/66       |
| 6,672,876 | B1 | * | 1/2004  | Takekoshi     | H01R 13/2407 |
|           |    |   |         |               | 439/66       |
| 6,785,148 | B1 |   | 8/2004  | Ishida et al. |              |
| 6,948,940 | B2 | * | 9/2005  | Lindsey       | G01R 1/06733 |
|           |    |   |         |               | 257/E23.068  |
| 7,523,852 | B2 |   | 4/2009  | Buchwalter et al. |          |
| 7,566,575 | B2 | * | 7/2009  | Murata        | H01R 13/2421 |
|           |    |   |         |               | 257/531      |
| 9,717,148 | B2 | * | 7/2017  | Hahn          | H01L 24/48   |
| 10,477,698| B1 | * | 11/2019 | Hart          | H05K 3/3436  |

* cited by examiner

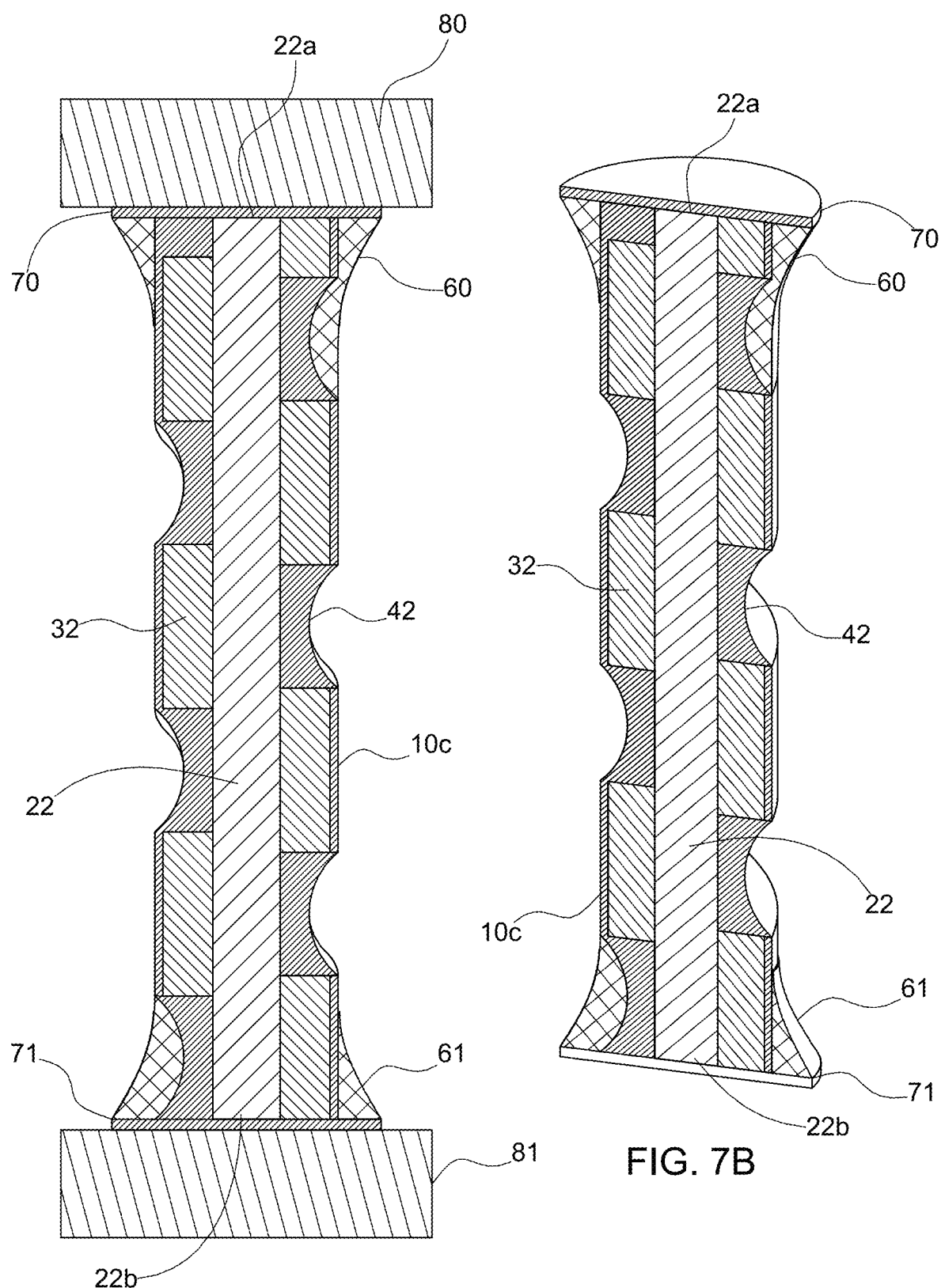

| MATERIALS | | | |
|---|---|---|---|
| INTERNAL CORE (22) | EXTERIOR SLEEVE (32) | SOLDER COATING (42, 44) | SOLDER FILLET (60, 61) |
| Copper Gold Silver Tin Platinum Palladium or Beryllium-Copper | Lead Free SCN305 Sn96.5/Cu3.0/Ni0.5 | Lead Free Sn96.5/Cu0.8/Ag0.7/Bi2.0 | Lead Free SAC305 Sn96.5/Ag3.0/Cu0.5 and/or SN100C Sn99.2/Cu0.7/Ni0.05/Ge0.009 with other dopants or formulations |
| Copper Gold Silver Tin Platinum Palladium or Beryllium-Copper | Tin-Lead Pb80/Sn20 Pb85/Sn15 Pb90/Sn10 Pb93.5/Sn5/Ag1.5 | Tin-Lead Sn63/Pb37 and/or Sn62/Pb36/Ag2 | Tin-Lead Sn63/Pb37 and/or Sn62/Pb36/Ag2 |

FIG. 8

DIMENSION TABLE

| Major Diameter of Column (D10) | Minor Diameter of Column (D42) | Core Diameter (D22) | Sleeve Radial Thickness (T32) | Pads on LGA/CGA and PCB (H70/71) | Height of Column (H10) | Width of Sleeve (H32) | Height of Space (H40) | Thickness of Outer Solder Layer (T44) |
|---|---|---|---|---|---|---|---|---|
| 0.10mm | 0.050mm | 0.050mm | 0.025mm | 0.15mm | 0.25~0.9mm | 0.05~0.10mm | 0.02~0.05mm | 0.006~0.025mm |
| 0.125mm | 0.050mm | 0.050mm | 0.0375mm | 0.20mm | 0.30~1.1mm | 0.10~0.15mm | 0.05~0.08mm | 0.006~0.025mm |
| 0.15mm | 0.075mm | 0.075mm | 0.0375mm | 0.22mm | 0.40~1.3mm | 0.10~0.15mm | 0.05~0.08mm | 0.006~0.025mm |
| 0.175mm | 0.075mm | 0.075mm | 0.050mm | 0.25mm | 0.45~1.5mm | 0.15~0.25mm | 0.07~0.12mm | 0.006~0.025mm |
| 0.20mm | 0.100mm | 0.100mm | 0.050mm | 0.30mm | 0.50~1.8mm | 0.15~0.25mm | 0.07~0.12mm | 0.006~0.025mm |
| 0.25mm | 0.100mm | 0.100mm | 0.075mm | 0.35mm | 0.60~2.2mm | 0.20~0.30mm | 0.10~0.15mm | 0.006~0.025mm |
| 0.275mm | 0.125mm | 0.125mm | 0.075mm | 0.40mm | 0.70~2.4mm | 0.20~0.30mm | 0.10~0.15mm | 0.006~0.025mm |
| 0.30mm | 0.150mm | 0.150mm | 0.075mm | 0.45mm | 0.75~2.7mm | 0.20~0.30mm | 0.10~0.15mm | 0.006~0.025mm |
| 0.335mm | 0.135mm | 0.135mm | 0.100mm | 0.45mm | 0.80~3.0mm | 0.25~0.40mm | 0.12~0.20mm | 0.006~0.025mm |
| 0.35mm | 0.150mm | 0.150mm | 0.100mm | 0.47mm | 0.90~3.1mm | 0.25~0.40mm | 0.12~0.20mm | 0.006~0.025mm |
| 0.375mm | 0.175mm | 0.175mm | 0.100mm | 0.50mm | 0.95~3.3mm | 0.25~0.40mm | 0.12~0.20mm | 0.006~0.025mm |
| 0.40mm | 0.200mm | 0.200mm | 0.100mm | 0.60mm | 1.0~3.6mm | 0.25~0.40mm | 0.12~0.20mm | 0.006~0.025mm |
| 0.45mm | 0.200mm | 0.200mm | 0.125mm | 0.70mm | 1.2~4.0mm | 0.30~0.50mm | 0.15~0.25mm | 0.006~0.025mm |
| 0.50mm | 0.250mm | 0.250mm | 0.125mm | 0.80mm | 1.3~4.5mm | 0.30~0.50mm | 0.15~0.25mm | 0.006~0.025mm |

FIG. 9

LEAD FREE SOLDER COLUMNS AND METHODS FOR MAKING SAME

BACKGROUND

Field

Embodiments of the present disclosure relate generally to novel solder column structures, including novel lead free solder column structures, and methods for making the same.

Description of the Related Art

Typically, intermetallic connections are formed between a plurality of solder columns and the conductive pads on a land grid array (LGA) substrate. Initially, a layer of solder paste is applied to cover the array of conductive pads on the LGA. After heating, the solder paste reflows on the conductive pads causing an intermetallic connection between the solder columns and the conductive pads on the LGA. The LGA substrate material may consist of ceramic, plastic or silicon materials. After completion of the reflow process, the LGA with solder columns is known in the art as a column grid array (CGA) or ceramic column grid array (CCGA). In general, the number of solder columns on a CGA device may range from 4 to 10,000, or more, as the density of electronic devices and integrated circuit packages continues to increase.

An alternative to CGA column grid array devices is a ball grid array (BGA) device. BGA devices contain an array of solder spheres (balls) to provide electrical connections between the conductive pads on a BGA substrate and the printed circuit board (PCB). In the art, BGA substrates that are constructed of ceramic material (such as alumina or $Al_2O_3$) are known as a ceramic ball grid array (CBGA). Ceramic substrates are often required in harsh environments or when excessive heat and power is present.

However, one potential problem with BGA devices is that a substantial difference in the coefficient of thermal expansion (CTE) can exist between BGA substrates and the PCB board. The potential problem with CTE differences typically becomes more problematic when large size BGA substrates are attached to PCB boards that are made of plastic glass-woven material such as FR-4 or other laminate materials (known in the art as organic substrate or organic PCB board). Such differences in the coefficient of thermal expansion can cause deformation of the solder spheres (solder balls) interconnecting a BGA device to a PCB board. Over time, the electrical connection between the solder ball and metal substrate pad can break between large size organic BGA substrates and a plastic glass-woven PCB due to CTE mismatching issues.

SUMMARY OF SOME NON-LIMITING EMBODIMENTS

As a way to reduce the size and mass of semiconductor packages, attention should be placed on developing solutions that can transfer heat through thermally conductive columns from the underside of heat generating semiconductor chips without the need to add bulky and heavy to the top of such CGA packages.

Therefore, a better solder column design is needed to overcome each of these drawbacks and limitations. In particular, a more robust and reliable method and structure for maintaining the columnar shape and structural integrity of the solder column is needed that also meets the requirements of RoHS directives to use lead-free (Pb-Free) materials. Furthermore, there is a need for a compliant column structure for absorbing mechanical stresses caused by CTE mismatch, conducting electrical signals with a minimum of distortion and thermally conducting heat away from the underside of the CGA substrate through the column core into ground layers of a printed circuit board using lead free (Pb-Free) materials. The embodiments of the present disclosure provide solutions to the aforementioned needs. The details of such embodiments will be described in greater detail below.

Disclosed herein are embodiments of solder column structures that can be configured to avoid catastrophic collapse of the column grid array (CGA) during reflow, and methods of making such structures. Any of the solder column embodiments disclosed herein can have a metal core that can conduct more heat through the column from the underside of the CGA substrate to the ground layers of the printed circuit board.

Disclosed herein are embodiments of solder column devices that can include an inner core having an outer surface, an outer sleeve surrounding a portion of the outer surface of the inner core and including a solder material, at least one space along a length of the outer sleeve wherein the outer surface of the inner core is not covered by the outer sleeve, and a second layer including a solder material coupled with a portion of the outer surface of the inner core within the at least one space. In some embodiments, the inner core can be configured to support the solder column in at least an axial direction of the solder column so as to prevent a collapse of the solder column at temperatures above a liquidus temperature of the solder material of the outer sleeve and the solder material of the second layer. Further, in some embodiments, the inner core can include a conductive metallic material.

Any embodiments of the solder column devices disclosed herein can include, in additional embodiments, one or more of the following features, components, and/or details, in any combination with any of the other features, components, and/or details of any other embodiments disclosed herein: wherein the solder column is lead free; wherein the major diameter is from approximately 0.10 mm (0.004 inch) to approximately 0.50 mm (0.020 inch); wherein the minor diameter is from approximately 0.05 mm (0.002 inch) to approximately 0.25 mm (0.010 inch); wherein the solder column can be configured such that the solder column material will form a bond with conductive pads of an LGA/CGA and/or a printed circuit board without the solder column collapsing when the sleeve structure material is in a plastic molten state; and/or wherein a first end of the solder column is configured to form a bond with a conductive pad of an LGA/CGA and/or a printed circuit board with a use of a solder paste when a temperature of the solder paste exceeds the liquidus temperature of the solder paste.

Inner Core:

Any embodiments of the solder column devices disclosed herein can include, in additional embodiments, one or more of the following features, components, and/or details, in any combination with any of the other features, components, and/or details of any other embodiments disclosed herein: wherein a melting point of the inner core is greater than the liquidus temperature of the solder material of the outer sleeve and the solder material of the second layer; wherein the inner core can be configured to not collapse at temperatures above the liquidus temperature of the solder material of the outer sleeve and the solder material of the second layer; wherein the inner core includes copper; wherein the inner core has a generally cylindrical shape; wherein the inner core is made from a wire material; wherein each of the outer sleeve and the second layer has a radial thickness that is less than a diameter of the inner core; wherein the inner core includes a lead-free material; wherein a major diameter of the solder column is equal to or greater than twice a diameter of the inner core; wherein the inner core has a diameter from approximately 0.05 mm (0.002 inch) to approximately 0.25 mm (0.010 inch); wherein a minor diameter of the solder column is greater than or approximately equal to a diameter of the inner core; wherein the solder column can be configured such that the outer surface of the inner core is at least substantially completely covered by the outer sleeve and the second layer; wherein the solder column can be configured such that the outer surface of the inner core is completely covered by the outer sleeve and the second layer; wherein the inner core is further configured to improve a conduction of heat through the solder column; and/or wherein the inner core includes at least one of copper, gold, silver, tin, platinum, palladium or beryllium-copper Spaces:

Further, any embodiments of the solder column devices disclosed herein can include, in additional embodiments, one or more of the following features, components, and/or details, in any combination with any of the other features, components, and/or details of any other embodiments disclosed herein: wherein the at least one space extends along an entire length of the inner core; wherein the at least one space extends helically around the outer surface of the inner core along an entire length of the inner core; wherein the at least one space has a height in an axial direction of the solder column that is less than a diameter of the inner core; wherein the at least one space in the outer sleeve has a height from approximately 0.05 mm (0.002 inch) to approximately 0.25 mm (0.010 inch); wherein the at least one space includes a plurality of spaces along a length of the outer sleeve; wherein the at least one space can be configured to provide additional flexibility to the solder column to improve the ability of the solder column to absorb stresses caused by mismatches in the coefficient of thermal expansion between the substrates interconnected by the solder column; and/or wherein the inner core does not collapse during reflow.

Outer Sleeve and Second Layer:

Additionally, any embodiments of the solder column devices disclosed herein can include, in additional embodiments, one or more of the following features, components, and/or details, in any combination with any of the other features, components, and/or details of any other embodiments disclosed herein: wherein the outer sleeve surrounds a majority of the outer surface of the inner core; wherein the outer sleeve extends helically around the outer surface of the inner core at a pitch that provides for the at least one space along the length of the outer sleeve; wherein a radial thickness of the outer sleeve is from approximately 0.025 mm (0.001 inch) to approximately 0.125 mm (0.005 inch); wherein at least one of the outer sleeve and the second layer includes a lead free alloy material or a lead-bearing alloy material; wherein at least one of the outer sleeve and the second layer includes at least one of a lead free alloy SCN305, a lead free alloy Sn96.5/Cu3.0/Ni0.5, a lead free alloy Sn96.5/Cu3.5, a lead free alloy Sn balance/Cu1.0-5.0/Ni0.1-2.0, a lead-bearing alloy Pb80/Sn20, a lead-bearing alloy Pb85/Sn15, a lead-bearing alloy Pb90/Sn10, a lead-bearing alloy Pb balance/Sn5-20, and a lead-bearing alloy Pb93.5/Sn5/Ag1.5; wherein the second layer also covers at least a portion of an outer surface of the outer sleeve; wherein the second layer also entirely covers an outer surface of the outer sleeve; and/or wherein the second layer includes at least one of lead free alloy of Sn96.5/Ag3.0/Cu0.5, Sn balance/Cu0.6-0.8/Ag0.5-0.7/Bi1.8-2.0, Sn balance/Cu0.6-0.8/Ag2.8-2.9/Bi2.5-2.9/Sb0.5-0.7/Ni0.04-0.06, Sn balance/Ag3.5/Bi0.5/In8.0, Sn balance/Ag3.5/Bi0.5/In4.0, Sn balance/Cu0.7/Ni0.05/Ge<0.010, Sn100C or lead-bearing alloy of Sn63/Pb37 or Sn62/Pb36/Ag2.

Also disclosed herein are embodiments of a solder column for mounting electronic components to a printed circuit board, including an inner core including a first material having a first liquidus temperature, an outer sleeve surrounding at least a majority of an outer surface of the inner core, the outer sleeve including a second material having a second liquidus temperature, and a plurality of spaces along a length of at least one side of the inner core between segments of the outer sleeve. In some embodiments, the solder column can be configured such that the inner core will support the outer sleeve and prevent a collapse of the outer sleeve at temperatures above a liquidus temperature of the outer sleeve. Further, in some embodiments, the spaces can be configured to provide additional flexibility to the solder column to improve the ability of the solder column to absorb stresses caused by mismatches in a coefficient of thermal expansion between a first substrate coupled with a first end of the solder column and a second substrate coupled with a second end of the solder column.

Any embodiments of the solder column devices disclosed herein can include, in additional embodiments, one or more of the following features, components, and/or details, in any combination with any of the other features, components, and/or details of any other embodiments disclosed herein: further including a second layer including a solder material coupled with a portion of the outer surface of the inner core within the plurality of spaces; wherein a maximum diameter of the solder column is at least equal to or greater than twice a diameter of the inner core; wherein a minimum diameter of the solder column is not less than a diameter of the inner core; wherein each of the plurality of spaces in the sleeve structure has a height that is less than, approximately equal to, or not more than two times greater than a diameter of the inner core; wherein the outer sleeve has a radial thickness that is less than the diameter of the inner core; and/or wherein the outer sleeve extends helically along at least a substantial portion of the length of the inner core.

Some embodiments comprise an improved Column Grid Array (CGA) solder column, comprising a conductive metallic inner core (e.g., copper) encased by a compliant lead free solder alloy outer sleeve structure. The inner core can be configured such that it will support the solder alloy outer sleeve so as to prevent a collapse of the solder column at temperatures exceeding a liquidus temperature of the solder paste joining the solder column to the semiconductor chip substrate and PC board. Optionally, a plurality of adjacent copper core solder columns, arranged in an array, serves as a heat sink to conduct excessive heat away from a heat generating semiconductor chip connected to the solder column while transferring such heat to the ground layers of a printed circuit board (PCB). Moreover, the compliant solder alloy sleeve structure provides compliancy to absorb strain and mechanical stress caused by a difference in the coefficient of thermal expansion (CTE) of non-compatible materials between the heat generating semiconductor chip and the printed circuit board.

Some embodiments of the improved solder columns disclosed herein are configured to provide a mechanically compliant, electrically conductive, and thermally conductive structure for use as an interconnection when joining semiconductor modules to printed circuit boards. In any embodiments, the inner core (which can be, in any embodiments, metallic) can be surrounded by a compliant sleeve that can include lead free (Pb-Free) solder alloy materials joined together by coating the entire structure with a wettable lead free (Pb-Free) solder alloy. Advantageously, during reflow at normal soldering temperatures, the ends of the column can liquefy without the solder column collapsing. This can advantageously form a diffused intermetallic connection with the solder paste wetted on the metallic pads of the module and secondarily to the metallic pads on the printed circuit board. Any solder column embodiments disclosed herein can also be made of or include lead-bearing materials. The solder columns disclosed herein can also provide attachment of the columns to LGA/CGA packages and to a printed circuit board with or without the use of solder paste, optionally using only a solder bump preform together with Tacky Flux.

Also disclosed herein are embodiments of solder column devices that can include an improved solder column including a cylindrically shaped inner core made from a conductive metal such as copper, gold, silver, tin, platinum, and/or a palladium or beryllium-copper alloy material, and an external solder alloy sleeve structure surrounding at least a majority of an outer surface of the conductive metal core, wherein the external solder alloy sleeve is configured such that the internal metal core will support the external solder alloy sleeve so as to inhibit (e.g., prevent) a collapse of the entire solder column at temperatures exceeding a liquidus temperature of the solder paste wetted on the metallic pads of the module and secondarily to the metallic pads on the printed circuit board.

Any embodiments of the solder column devices disclosed herein can include, in additional embodiments, one or more of the following features, components, and/or details, in any combination with any of the other features, components, and/or details of any other embodiments disclosed herein: wherein the diameter of the metal core does not exceed 60% of the overall diameter of the entire solder column; wherein the diameter of the metal core is not less than 30% of the overall diameter of the entire solder column; wherein the overall shape of the solder column approximately resembles a cylinder or pillar shape, where the total length of the column is at least 2.5 times the overall diameter of the column and the length of the column does not exceed 9.0 times the overall diameter of the column; wherein the diameter of the internal metal core has a diameter from approximately 0.050 mm (0.002 inch) to approximately 0.250 mm (0.010 inch); wherein the thickness of the solder alloy sleeve in the radial direction is approximately 0.025 mm (0.001 inch) to approximately 0.200 mm (0.008 inch); wherein the solder column is configured such that the column materials will form a bond with the conductive pads of an LGA/CGA and/or a printed circuit board without the column collapsing when the solder paste is in a molten state; wherein the metal core is further configured to improve a conduction of heat through the solder column; wherein the solder column is configured such that solder from the outer solder sleeve will form a bond with solder paste or solder bump preforms applied to conductive pads of an LGA/CGA and/or a printed circuit board when the temperature exceeds the liquidus temperature of the solder paste or solder bump; wherein at least a portion of the metal core forms an intermetallic bond to the external solder sleeve; wherein the metal core includes at least one of copper, gold, silver, tin, platinum, palladium or beryllium-copper alloy; wherein the solder column has a rectangular or circular cross-section; wherein the outer solder sleeve surrounds approximately an entire length of the solder core; wherein the plurality of spaces on the outer solder sleeve are partially or fully filled with solder; wherein the radial boundary of the outer sleeve of the column can vary to be as large as the major diameter of the column or can be as small as the minor diameter of the column; and/or wherein the helical spaces, slits or slots in the sleeve are configured to provide additional flexibility to the solder column to improve the ability of the solder column to absorb stresses caused by mismatches in the coefficient of thermal expansion between the substrates interconnected by the solder column.

Also disclosed herein are embodiments of an electronic system, including one or more printed circuit boards with a plurality of solder columns having any of the features, components, and/or details of any solder column embodiments disclosed herein. Also disclosed herein are embodiments of an electronic system, including a printed circuit board with a plurality of solder columns having any of the features, components, and/or details of any solder column embodiments disclosed herein coupled with the printed circuit board. Also disclosed herein are embodiments of a land grid array including a plurality of solder columns having any of the features, components, and/or details of any solder column embodiments disclosed herein. Also disclosed herein are embodiments of a ceramic column grid array including a plurality of solder columns having any of the features, components, and/or details of any solder column embodiments disclosed herein. Also disclosed herein are embodiments of an organic substrate column grid array including a plurality of solder columns having any of the features, components, and/or details of any solder column embodiments disclosed herein.

BRIEF DESCRIPTION OF THE DRAWINGS

FIG. 7A is a front facing cross-sectional view of the solder column embodiment shown in FIG. 6B attached to an LGA/CGA substrate and to a PCB board.

FIG. 7B is a perspective cross-sectional view of the cross-section of the solder column embodiment shown in FIG. 6B.

FIG. 8 illustrates a table of optional materials that can be used in any of the solder column embodiments disclosed herein and/or in solder paste to optionally reflow such solder column embodiments to conductive pads on an LGA/CCGA substrate and/or conductive pads on a printed circuit board.

FIG. 9 illustrates examples of different dimensions for any of solder column embodiments disclosed herein, as well as optional dimensions of some embodiments of the conductive pads on an LGA/CGA and/or printed circuit board used in combination with the solder column embodiments.

DETAILED DESCRIPTION OF SOME EXEMPLIFYING EMBODIMENTS

Figure 1A:
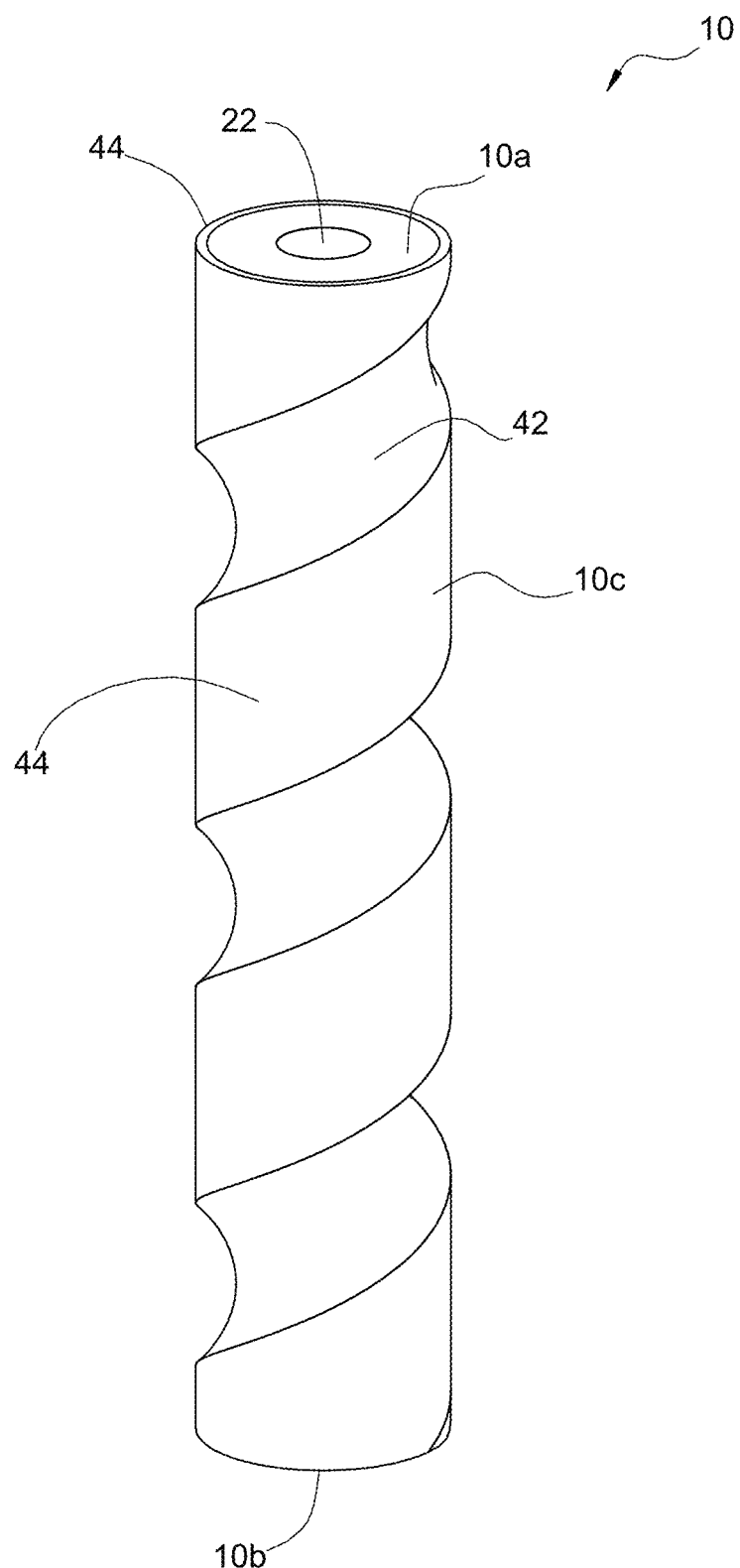
FIG. 1A is a perspective view of an embodiment of a solder column including an inner core surrounded by an outer sleeve after the core and outer sleeve have been immersed in liquefied solder.

The problem with CTE mismatch has been addressed by using cylindrical solder columns instead of solder spheres (solder balls) as the electrical interconnect between module substrates and PCB boards. Traditionally, cylindrically shaped solder columns with tin-lead (Sn—Pb) cores tend to be used in applications in the military, aerospace and defense fields and typically have a diameter of approximately 0.50 mm (0.020 inch) and a height of approximately 2.2 mm (0.087 inch). However, solder columns used in fields of commercial (non-defense) applications including high power computer servers, artificial intelligence (Ai), 5G wireless communications and micro-electronics in general, may be as small as 0.10 mm (0.004 inch) in diameter or more than 0.50 mm (0.020 inch) in diameter. Furthermore, the length of solder columns used in commercial applications may be as short as 0.25 mm (0.010 inch) or as long as 4.5 mm (0.177 inch) or more. Moreover, there is a need in the fields of commercial (non defense) related applications to use lead free (Pb-Free) materials in order to satisfy the directives of Restriction of Hazardous Substances (RoHS) originating in the European Union and in other legislative bodies in the world.

The conductive pads on the LGA substrate are typically covered with a controlled thickness of solder paste before attaching a plurality of solder columns to the LGA substrate. In some cases, solder paste consisting of tin-lead alloy, such as Sn63/Pb37, may be preferred for applications within the fields of aerospace, military and defense industries. However, in commercial fields, lead free (Pb-Free) solder paste alloys such as SAC305 (Sn96.5/Ag3.0/Cu0.5), or other alloys containing Tin (Sn), Silver (Ag), Copper (Cu), Nickel (Ni), Germanium (Ge), Bismuth (Bi), Indium (In) and other dopants or additives, may be used for applications requiring lead-free (Pb-Free) materials.

Solder columns are generally vertically positioned perpendicularly onto a corresponding array of conductive pads on the LGA substrate. The substrate, together with high temperature solder columns and a layer of low temperature solder paste are typically then heated so that the solder paste is reflowed to make an intermetallic fillet connection between the solder columns and the LGA conductive pads, without melting or damaging the solder columns. The completed package with attached solder columns is known in the art as a column grid array (CGA) or ceramic column grid array (CCGA) package.

A secondary procedure is typically required to mount the CGA package onto the PCB board. The process of connecting the CGA package to the PCB board requires the CGA to be reflowed again, without melting or collapsing the solder columns. A controlled layer of low temperature melting solder paste can be applied to a corresponding plurality of contact pads on the PCB board. The CGA package can be placed onto the solder paste covered pads on the PCB board. The PCB board along with one or a plurality of CGA packages (as well as other components) can then be heated and reflowed, which can result in an intermetallic fillet that holds the CGA solder columns to the PCB board.

Conventional processes have put a focus on avoiding collapse of the vertically positioned column(s) during the reflow process by selecting column materials with higher melting points compared to the onset of melting of the solder paste that wets and joins the column to the metal pads on the CGA package to the PCB boards. In conventional designs, typically heavy and bulky heat sinks are mounted to the top side of CGA packages as a remedy to conduct heat away from the CGA.

Disclosed herein are embodiments of improved solder columns (that can be lead free) and methods for making improved solder columns. The improved solder columns or solder column structures disclosed herein can absorb mechanical stress(es) caused by differences in the coefficients of thermal expansion (CTE) of mating or abutting materials or components that pass electrical signals and conducting heat between column grid array (CGA) integrated circuit modules used in computer servers. The improved solder columns or solder column structures disclosed herein can also provide an interconnect in an array pattern on ceramic, organic or silicon substrates when joining micro-electronic packages to corresponding metal pads on printed circuit boards. Any embodiments disclosed herein can be configured such that the solder columns can bond to the metal pads on the LGA and printed circuit board with solder paste during reflow.

The first attachment of the solder column is normally to the conductive (metalized) pads on the LGA component housing substrate, module, silicon die or silicon wafer, generally known in the art as the "First Level" (or Level 1) attachment. After the First Level attachment is completed, then, in some embodiments, days, weeks, months or even years later, the CGA electronic component housing substrate (together with previously mounted solder columns), is attached the PCB Board. This is known in the art as the "Secondary Level" (or Level 2) attachment. During the Secondary Level attachment, the solder in and around the columns temporarily liquefies (reflows) again. After cooling down and solidifying, one end of the column is welded to the LGA/CGA substrate and the other end of the column is welded to the PCB board. The above describes a typical two step soldering process of attaching columns.

As will be described in greater detail, any solder column 10 embodiments disclosed herein can have an improved inner core 22 (also referred to herein as a core) and/or outer sleeve 32 that can be configured to increase the strength and integrity of the solder columns, so that the solder columns can retain sufficient mechanical, electrical and thermal integrity without collapsing during reflow of the columns to the LGA and, secondarily, when the CGA substrate is reflowed to the printed circuit board. Further, the column structures disclosed herein can optionally be configured to absorb mechanical stresses caused by coefficient of thermal expansion (CTE) mismatch, to conduct electrical signals with minimum of distortion, and to thermally conduct heat away from the underside of the CGA substrate through the inner core into ground layers of the PCB printed circuit board. As described, such components can be made from lead containing or lead free materials.

Some solder column 10 embodiments disclosed herein include an outer solder alloy sleeve 32 structure integrated with the inner core 22 configured to avoid catastrophic collapse of the LGA/CGA during reflow. At least some of the solder column 10 embodiments disclosed herein are configured to achieve little or no collapse during reflow. As shown in FIG. 1B, the outer sleeve 32 can extend between the first end 10a of the column 10 and the second end 10b of the column 10. In other embodiments, the outer sleeve 32 can extend only partially between the first end 10a of the column 10 and the second end 10b of the column 10, for example and without limitation extending only 90% (or approximately 90%) of the length of the column 10, or from 80% (or approximately 80% or less than 80%) to 95% (or approximately 95% or more than 95%) of the length of the column 10.

The outer sleeve 32 of any embodiments disclosed herein can be configured to allow the column to include readily accessible alloys which can be reflowed to bond the LGA/CGA to the printed circuit board through a column structure without consequences of column collapsing as the temperature exceeds the liquidus temperature of the solder paste material that wets to the LGA substrate and/or PCB board. For example and without limitation, in any embodiments disclosed herein, the outer sleeve 32 can include or be made from any lead free material such as Sn96.5/Cu3.0/Ni0.5 abbreviated as SCN305. Alternatively, any embodiments of the outer sleeve 32 can include a lead bearing solder alloy of any non-limiting combination of lead (Pb) over approximately 80% by weight and tin (Sn) remainder (balance) by weight (e.g., Pb90/Sn10, Pb85/Sn15, Pb80/Sn20, Pb93.5/Sn5/Ag1.5, etc.), or any of the materials shown in FIG. 8.

Non-collapsible columns avoid changes in impedance and operating frequency (detuning) issues commonly encountered when the spacing between the LGA substrate and the printed circuit board is altered. Additionally some embodiments disclosed herein are directed to methods and devices for constructing an outer sleeve structure that is joined into the surface of the inner core (which can be, but is not required to be, metallic), reducing resistance build up caused by oxidization and contamination between the sleeve and the inner core, and methods for constructing solder columns with outer sleeves to electrically join and bond the CGA to the PCB Board using solder paste during reflow with maximum conductivity and minimum electrical resistance between the LGA/CGA and the printed circuit board.

Figure 2B:
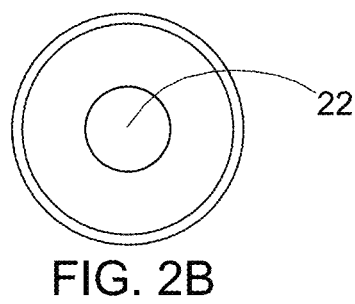
FIG. 2B is a top view of the solder column embodiment of FIG. 1A.
Figure 2C:
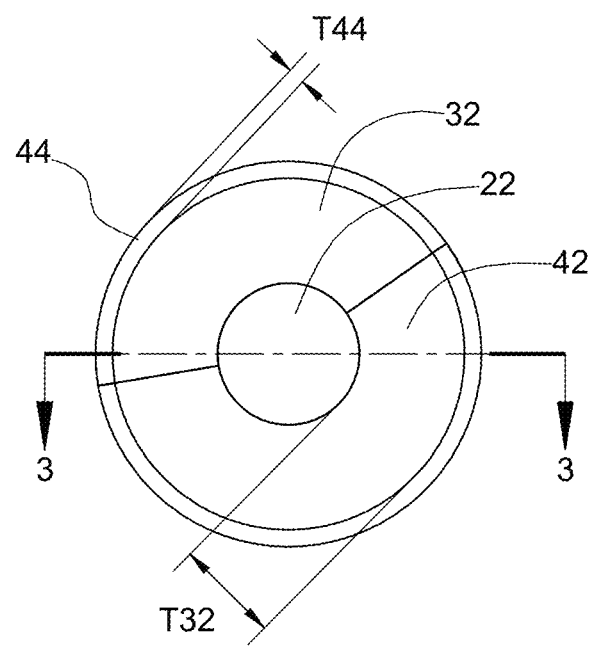
FIG. 2C is an enlarged top view of the solder column embodiment of FIG. 2B.
Figure 2A:
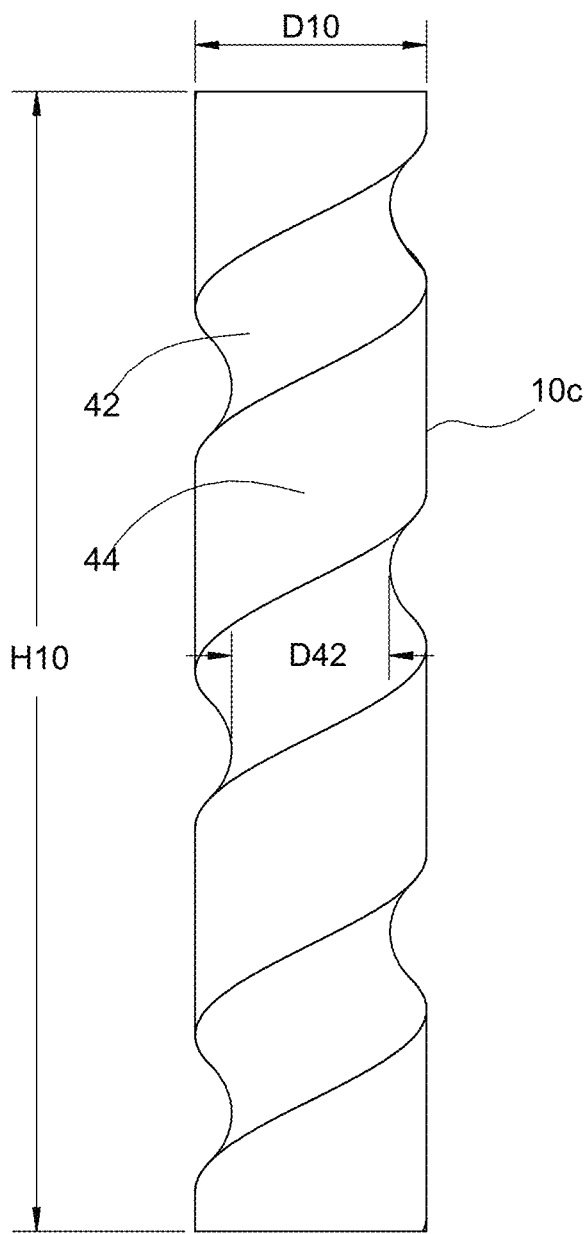
FIG. 2A is a side view of the solder column embodiment shown in FIG. 1A.

The column 10 of any embodiments can have a major diameter D10 (to the outer surface 10c of the solder column 10), as shown in FIG. 2A, of any of the values or approximately any of the values shown in the table of FIG. 9.

FIG. 9 is a table of dimensions of any of the embodiments of the solder column 10 disclosed herein, including the major diameter D of any of the embodiments of the solder column 10 disclosed herein, the minor diameter D42 of any of the embodiments of the solder column 10 disclosed herein, the diameter D22 of the inner core 22 of any of the embodiments of the solder column 10 disclosed herein, the radial thickness T32 of the outer sleeve 32 of any of the embodiments of the solder column 10 disclosed herein, and the diameter of the conductive pad 70 of the CGA substrate 80 and diameter of the conductive pad 71 of the PC Board 81.

Figure 4:
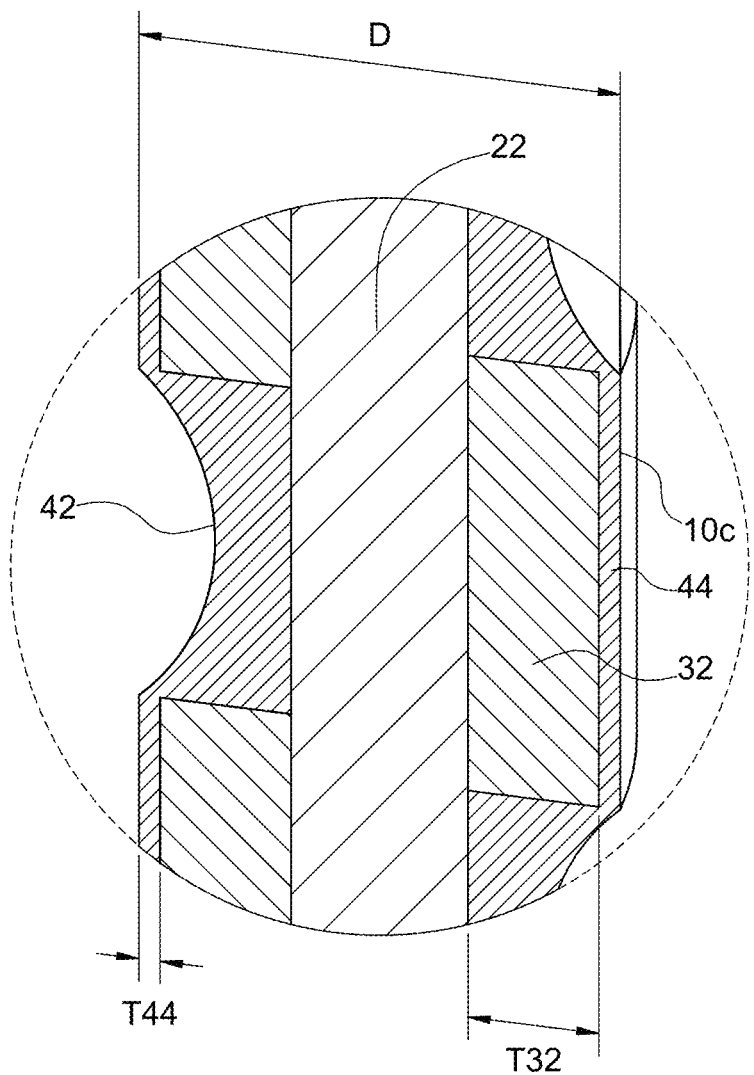
FIG. 4 is an enlarged view of a portion of the section view of FIG. 3.

The major diameter D10 is the diameter of the outer surface of the column 10 after the column 10 has been immersed in a solder bath and the solder column 10 has an outer layer 44 of solder (also referred to as the outer solder layer). As such, the major diameter D of column 10 can be equal, in some embodiments, to the diameter of the core 22 plus twice the radial thickness T32 (as shown in FIG. 4) of the outer sleeve 32, plus twice the radial thickness T44 of the outer solder layer 44 (as shown in FIG. 4). In some embodiments, the radial thickness T44 of the outer solder layer 44 can vary depending on factors such as the angle of the solder column in the molten solder bath and the time that the solder column is in the molten solder bath, and can even vary by location on the solder column. For example and without limitation, some embodiments of the solder column 10 can have a radial thickness T44 of from approximately 0.005 mm (or less, in some embodiments) to approximately 0.025 mm (or more, in some embodiments).

Figure 6A:
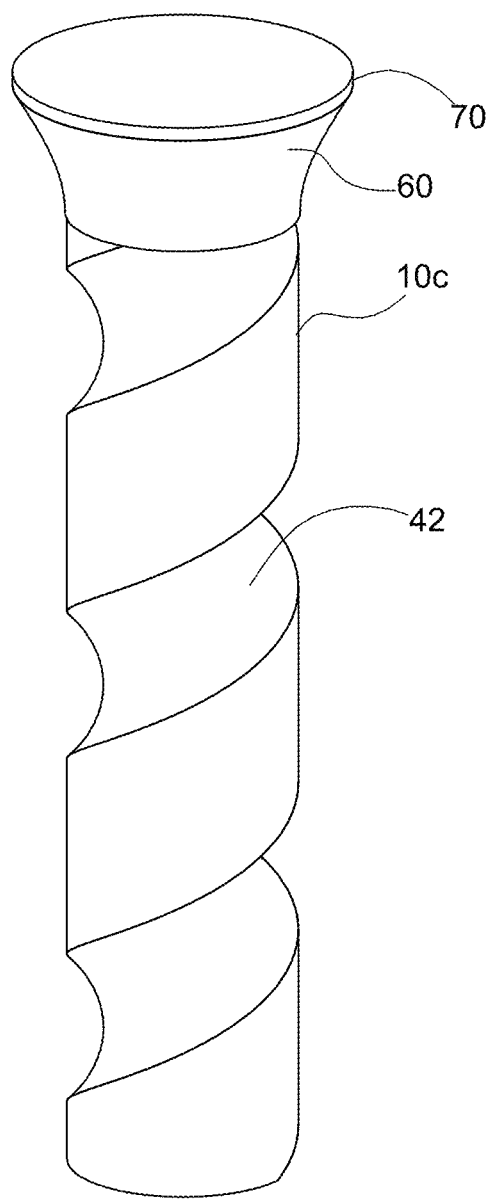
FIG. 6A is a perspective view of the solder column shown in FIG. 1A after reflowing one end of the column to a conductive pad of an LGA/CGA substrate.
Figure 6B:
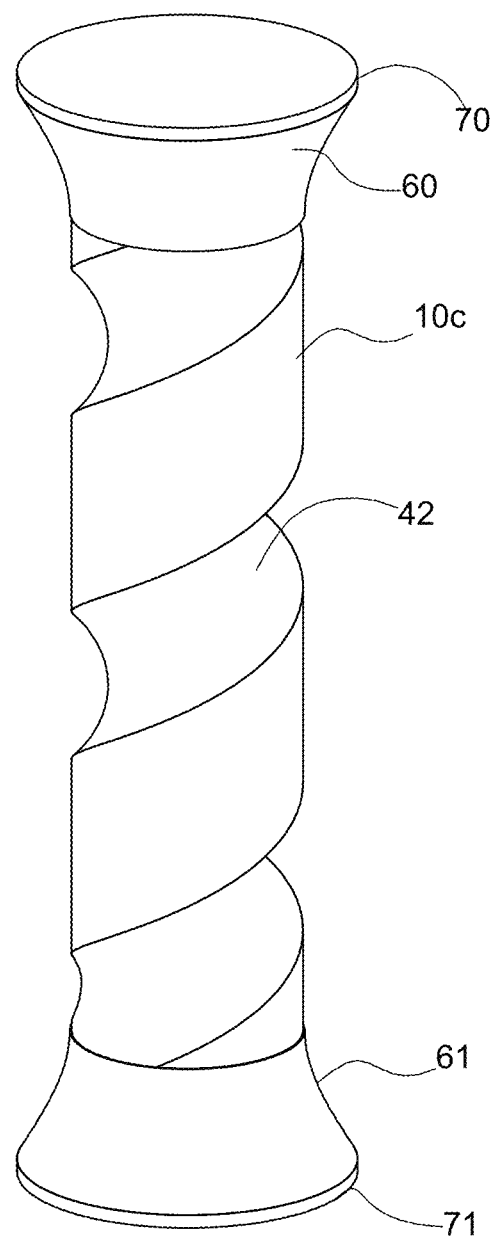
FIG. 6B is a perspective view of the solder column embodiment shown in FIG. 6A after also reflowing the other end of the column to a conductive pad on a PCB printed circuit board.

For example and without limitation, in some embodiments, the column 10 can have a major diameter D10 of 0.10 mm (or approximately 0.10 mm or smaller than 0.10 mm) to 0.50 mm (or approximately 0.50 mm or more than 0.50 mm), or of any values or ranges of values therebetween, or of any values suitable to the application that the solder column 10 will be used for. In some embodiments, the major diameter D10 of the column 10 can be constrained by the pitch (spacing) of the conductive pads 70 on the CGA package, as well as by the diameter of the conductive pad 71 on the PCB boards, as shown in FIGS. 6A, 6B, 7A and 7B. FIG. 6A is a perspective view of the solder column embodiment shown in FIG. 2A with solder fillet 60 attached to a metal pad of LGA/CGA substrate 70 shown. FIG. 6B is a perspective view of the solder column embodiment in FIG. 6A with solder fillet 61 attached to a metal pad of a PC Board 71. FIG. 7A is a section view of the solder column 10 embodiment shown in FIG. 1A with fillet 60 after reflowing and connecting one end of the column 10 to a conductive pad 70 on a LGA/CGA substrate 80. Fillet 60 can be formed by applying a controlled thickness of solder paste onto conductive pad 70, then reflowing the column structure above the liquidus temperature of the solder paste on pad 70. In some embodiments, in actual practice, the solder from the fillet 60 may flow unevenly when the solder heats up and reflows around the ends of the column 10. Further, the solder in the fillets 60 can creep up or down the ends of the columns. Some of the solder 60 may flow into or over the solder fill 42 and/or may flow more on one side than the other. In other words, the solder 42, 44, 60, and 61 may not be as symmetrical as shown in the figures when the solder has cooled and solidified. The other end of the solder column 10 embodiment shown in FIG. 7A can be reflowed to a conductive pad 71 on the printed circuit board 81 with fillet 61 joining the column structure to the conductive land pad 71 on the printed circuit board. Fillet 61 can be formed by applying a controlled thickness of solder paste onto conductive pad 71, then reflowing the column structure above the liquidus temperature of the solder paste on pad 71. FIG. 7B (shown for clarity without LGA/CGA substrate 80 and without printed circuit board 81) is a perspective sectional view of FIG. 7A.

Figure 5A:
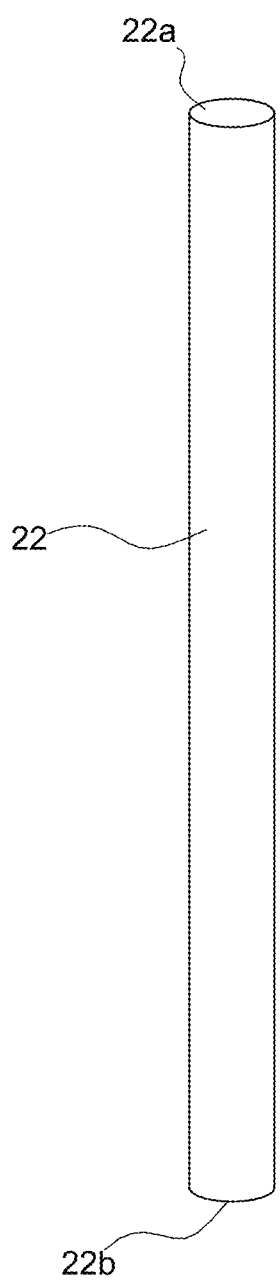
FIG. 5A is perspective view of the embodiment of the inner core shown in FIG. 1B.
Figure 5B:
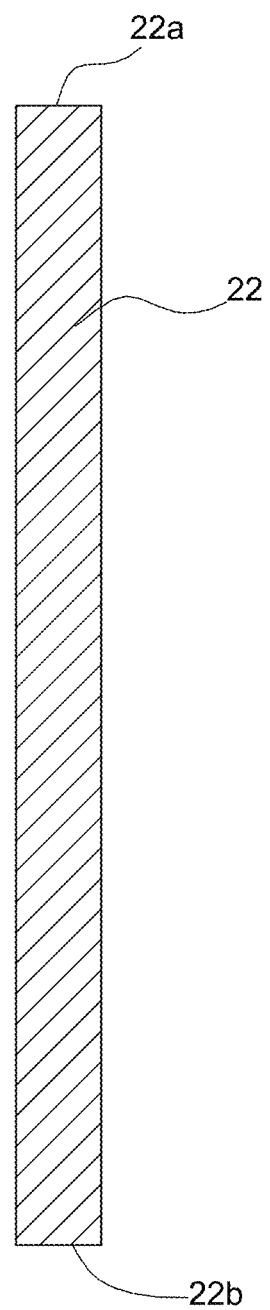
FIG. 5B is a cross-sectional view of the inner core shown in FIG. 5A, taken through the axial centerline of the inner core.

As mentioned, with reference to FIG. 1B, any embodiments the solder column 10 disclosed herein can include an inner core 22 surrounded by an outer sleeve 32. The core 22 can have a first end 22a and a second end 22b, and can, in some embodiments, have a cylindrical or generally cylindrical shape, as shown in FIGS. 5A-5B, which are a perspective view and a section view, respectively, of an embodiment of a core 22.

The inner core 22 of any embodiments disclosed herein can have joints along and/or on the surface of the inner core 22 joining the core 22 to the solder outer sleeve 32 in order to make the embodiment of column 10 stronger. In other words, some embodiments of the solder column 10 can be configured so that the molten solder can flow into the a space between the outer sleeve 32 and an outside surface 22c of the inner core 22 to bond or couple the outer sleeve 32 to the inner core 22. In some embodiments, channels or recesses can be formed in one or both of the outer surface 22c of the inner core 22 and an inner surface of the outer sleeve 32 to permit molten solder to bond or coupled portions of the outer sleeve 32 to the inner core 22. Some embodiments of such a configuration can conduct more heat through the inner core 22 of the column 10 from the underside of the CGA substrate 70 to the ground layers of the printed circuit board 81 that are connected to pad 71. The benefits of conducting more heat away from the CGA substrate 80 can include, but are not limited to, extending the life to the silicon chip system housed in the CGA by operating at a lower temperature differential compared to ambient. In general, excessive heat can result in the shortened life of a silicon chip. Conducting heat from the bottom side of the CGA package 80 through the inner core 22 of the column 10 can potentially reduce the size, mass and weight of a heavy heat sink traditionally mounted on the top side of conventional CGA packages.

In any embodiments disclosed herein, the inner core 22 can be metallic. Further, in any embodiments disclosed herein, the inner core 22 can be cylindrically shaped. In some embodiments, the inner core 22 can be formed from wire. In any embodiments disclosed herein, the core 22 can be formed from or include a cylindrically shaped metallic wire. In any embodiments disclosed herein, the core 22 can be made of copper, gold, silver, tin, platinum, palladium, beryllium-copper and/or any combination of less than approximately 1% by weight and alternatively other additives or dopants, or any other suitable material or combination or alloy thereof.

Figure 3:
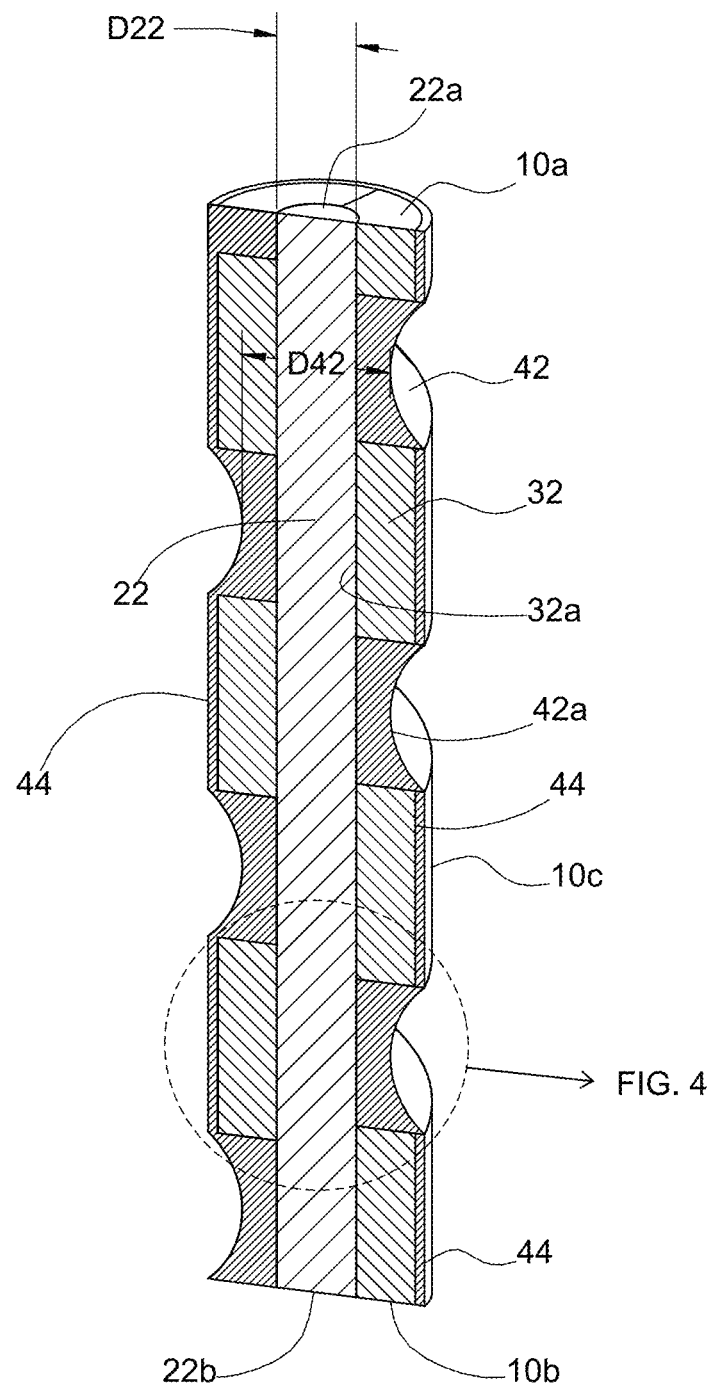
FIG. 3 is a cross-sectional perspective view of the solder column embodiment of FIG. 1A, taken through lines 3-3 of FIG. 2C.

FIG. 3 is a sectional view of FIG. 2A showing the internal cylindrical metallic core 22 between a first end surface 10a of the solder column 10 and a second end surface 10b of the solder column 10. As shown in FIG. 3, the core 22 can have a cross-sectional size or diameter D22. Nonlimiting examples of diameters D22 of any of the embodiments of the core 22 are shown in the table of FIG. 9. Further, without limitation, any embodiments of the core 22 disclosed herein can have a diameter D22 that is from approximately 30% of the diameter D10 of the solder column, to approximately 60% of the diameter D10 of the solder column or of any values or of any ranges of values within any of the foregoing ranges.

With reference to FIG. 1B, the outer sleeve 32 can have a helical shape or a generally helical shape and can have pitch or angulation sufficient to cause the formation of spaces 40 between adjacent segments of the outer sleeve 32. In any embodiments, the outer sleeve 32 can have a height H32 of any of the values shown in the table of FIG. 9, or of approximately any of the values shown in the table of FIG. 9. Further, without limitation, some embodiments of the outer sleeve 32 can have a height H32 that is more than 5% (or approximately 5%) of the total height H10 of the solder column 10 to 40% (or approximately 40%, or less than 40%) of the total height H10 of the solder column 10, or of any values or of any ranges of values within any of the foregoing ranges.

In some embodiments, the outer sleeve 32 can comprise a plurality of annular rings positioned along a length of the inner core 22 so as to form spaces 40 along a length of the inner core 22. In some embodiments, the outer sleeve 32 can have a hollow cylindrical shape sized and configured to fit around the inner core 22, and can have a plurality of spaces 40 formed therein that extend entirely through a wall of the outer sleeve 32 so that the outer surface of the inner core 22 is exposed when the outer sleeve 32 is positioned over the inner core 22.

Additionally, in any embodiments, the outer sleeve 32 can have a thickness T32 of any of the values shown in the table of FIG. 9 of approximately any of the values shown in the table of FIG. 9. Further, without limitation, some embodiments of the outer sleeve 32 can have a thickness T32 that is more than approximately 20% of the height H32 of the outer sleeve 32, or less than approximately 50% of the height H32 of the outer sleeve 32, or of any values or of any ranges of values within any of the foregoing ranges. Without limitation, some embodiments of the outer sleeve 32 can have a thickness T32 that is more than approximately 20% of the diameter D10 of the solder column to less than approximately 40% of the diameter D10 of the solder column, or of any values or of any ranges of values within any of the foregoing ranges.

In any embodiments disclosed herein, the outer sleeve 32 can include or be made from any of the solder alloy materials shown in the table in FIG. 8. Other materials, solder materials or otherwise, can be used to make the outer sleeve 32 in other embodiments.

In any embodiments disclosed herein, each of the spaces 40 can be optimally sized to provide the benefits mentioned above. In some embodiments, the spaces 40 can be sized so that the solder fill 42 completely or substantially completely covers the outside surface 22c of the core 22 (i.e., so that no portion of the outside surface 22c is visible or is not covered by the solder fill 42). In any embodiments disclosed herein, the spaces 40 of any embodiments disclosed herein can have a height H40 as shown in FIG. 1B ranging from, but not limited to, more than approximately 0.025 mm (0.001 inch) to approximately 0.250 mm (0.010-inch).

Further, in any embodiments, the outer sleeve 32 can be formed so that the spaces 40 have a height H40 of any of the values shown in the table of FIG. 9, or of approximately any of the values shown in the table of FIG. 9. Further, in any embodiments, the spaces 40 formed between adjacent segments of the outer sleeve 32 can have a height H40 that is more than approximately 3% of the total height H10 of the solder column 10, to less than approximately 40% of the total height H10 of the solder column 10, or of any values or of any ranges of values within any of the foregoing ranges. Further, for example and without limitation, in any embodiments, the spaces 40 formed between adjacent segments of the outer sleeve 32 can have a height H40 that is less than approximately 85%) of the height H32 of the outer sleeve 32, to more than approximately 20% of the height H32 of the outer sleeve 32, or of any values or of any ranges of values within any of the foregoing ranges. In some embodiments, the outer sleeve 32 can have rounded corners (i.e., corner radiuses), sharp corners (as illustrated in FIG. 1B), beveled corners, or otherwise.

Figure 1B:
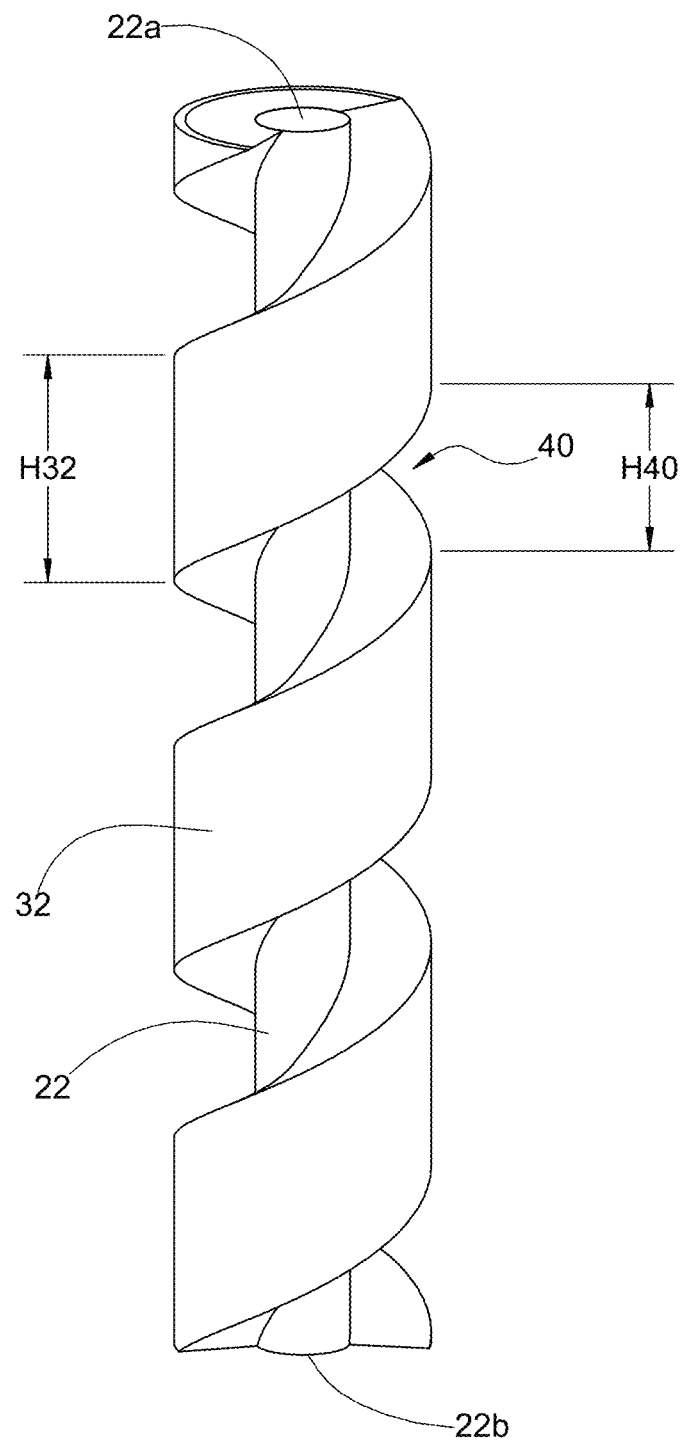
FIG. 1B is a perspective view of an embodiment of a solder column including an inner core surrounded by an outer sleeve before the inner core and outer sleeve have been immersed in liquefied solder.

FIG. 1A shows an embodiment of a solder column 10 of the present disclosure after the core 22 and the outer sleeve 32 (for example, the core 22 and the outer sleeve 32 shown in FIG. 1B) are immersed in a solder bath. As can be seen in FIG. 1A, the solder from the solder bath immersion can fill the spaces 40 with solder fill 42 and also form an outer solder layer 44 of solder that can cover the outer sleeve 32 such that the outer surface 10c of the solder column can be generally completely and continuously covered with a solder coating from the solder bath. The solder coating of the solder immersion bath that forms the solder fill 42 of the spaces 40 and the outer solder layer 44 can include or can be made from any of the material shown in the table of FIG. 8, in addition to or even in combination with any other suitable materials or elements.

In some embodiments, the solder fill 42 that can fill the spaces 40 and can be formed so as to have a concave or curved shaped outer surface 42a, the outer surface 42a of the solder fill 42 defining a minor diameter D42 (as shown in FIG. 3) of the column 10. As shown in FIG. 3, the column's minor diameter D42 is determined as the distance between the innermost points of the solder fill 42 in the column 10. In any embodiments disclosed herein, the minor diameter D42 and/or the major diameter D10 can be optimally sized to provide the benefits mentioned above, without permitting the inner core 22 to be visible or incompletely covered by the fill solder 42. Optionally, the minor diameter D42 of any embodiments disclosed herein can range from approximately 0.05 mm (0.002 inch) to approximately more than 0.250 mm (0.010 inch).

In any embodiments, the solder fill 42 can be formed so that the solder column 10 has a minor diameter D42 of any of the values shown in the table of FIG. 9, or of approximately any of the values shown in the table of FIG. 9. Without limitation, some embodiments of the solder column 10 can be formed so that the minor diameter D42 is more than 30% (or approximately 30%) of the major diameter D10 of the solder column, or less than 60% (or approximately 60%) of the diameter D10 of the solder column, or of any values or of any ranges of values within any of the foregoing ranges.

Embodiments of the solder column 10 disclosed herein having an inner core 22 and first and second end surfaces 10a, 10b, and including any of the materials show in FIG. 8 or other suitable materials have significant benefits over embodiments having a core consisting of a solder alloy. Embodiments with a solder alloy core can have significant drawbacks. For example, cores made with solder alloy have significantly higher amount of electrical resistance (e.g., lower electrical conductivity) and lower thermal conductivity (e.g. higher thermal resistivity). Whereas, an inner core 22 has significantly lower resistance and better thermal conductivity to carry transfer heat from the first end 10a of the column 10 (e.g., the end of the column 10 that connects to the CGA substrate 80, as shown in FIG. 7A) to the second end 10b of the column 10 (which can be opposite to the first end 10a of the column 10 and which can be connected to copper tracings and copper ground layers in the PC Board 81, as shown in FIG. 7A). For example, a core 22 including annealed copper has an electrical resistivity rating of 1.72 micro-ohms per centimeter; whereas, a solder alloy core consisting of SAC305 has an electrical resistivity rating of approximately 16.6 micro-ohms per centimeter.

In any embodiments disclosed herein, the solder columns can have a core 22 having an electrical resistivity rating that is from 10% (or approximately 10%) of the electrical resistivity rating of the core material of conventional solder columns to 30% (or approximately 30%) of the of the electrical resistivity rating of the core material of conventional solder columns.

Taller solder columns can generally be more compliant to better absorb CTE differential thermal expansion rates between the CGA substrate 80 and the PCB board 81. Accordingly, because of the increased robustness of some embodiments disclosed herein, any embodiments can have increased heights as compared to conventional solder balls (spheres) commonly found on Ball Grid Array (BGA) components. Any embodiments of the solder column 10 disclosed herein can have any suitable or desired height. Columns can be configured to be more structurally robust to support the load weight of heavy, large CGA substrates. In any embodiments disclosed herein, the length of column 10 between the first end 10a and the second end 10b of the solder column 10 or the first end 20a and the second end 20b of the core 20 can be more than 2.5 times (or approximately 2.5 times) the major diameter D to less than 9 times (or approximately 9 times) the major diameter D. In any embodiments disclosed herein, the height of the solder column H10 can be from 0.25 mm (0.010 inch) (or approximately 0.25 mm) to 4.5 mm (0.177 inch) (or approximately 4.5 mm).

As mentioned above, the core 22 and outer sleeve 32 can be immersed in a molten bath of liquefied solder. A full joint electrical and mechanical connection can be formed between the inside wall 32a of the outer sleeve 32 (as shown in FIG. 3) and the outer surface 22c of core 22 when the core 22 and the outer sleeve 32 are immersed in the molten bath of liquefied solder. In some embodiments, an intermetallic junction can be formed between the inside wall 32a of the outer sleeve 32 and the outer surface 22c of core 22 when the core 22 and the outer sleeve 32 are immersed in the molten bath of liquefied solder.

During immersion into a hot molten solder bath, the open spaces 40 (shown most clearly in FIG. 1B) can be partially or fully filled with a measured or desired volume of solder material 42 (also referred to herein as solder fill 42). The solder material can be any of the materials shown in the table of FIG. 8 or any other suitable materials or any combinations of the foregoing. Additionally, immersion in the molten bath of liquefied solder can form an outer layer 44 of solder that partially or fully covers the outer sleeve 32 and can form the outer surface 10c of column 10.

The lead molten solder bath of a lead free solder material can liquefy at temperatures ranging between approximately 208° C. and approximately 220° C. when the hot solder bath includes an alloy of approximately 96.5% tin (Sn) by weight and approximately 0.8% copper (Cu) and approximately 0.7% silver (Ag) by weight and 2.0% bismuth (Bi) by weight. Alternatively, a lead bearing molten solder bath optimally can include eutectic Sn63/Pb37 or Sn62/Pb36/Ag2 with molten temperatures between approximately 183° C. to approximately 220° C.

The solder column structures disclosed herein can achieve improved performance using improved materials and alloys, as described above and/or below. Any solder column structures or components thereof disclosed herein can be made using lead free or lead containing materials, including, without limitation, any of the alloys or materials shown in the table of FIG. 8. FIG. 8 is a table of materials that may be used to make the inner core 22, the outer sleeve 32, the solder fill 42, the solder layer 44, and the solder fillet 60 and 61 of any embodiments of the solder columns 10 disclosed herein.

Any of the materials shown in FIG. 8 can be used alone or in combination with the other materials of the table of FIG. 8. Additionally, any embodiments of the lead free solder columns disclosed herein or components can be reflowed to LGA/CGA substrate and/or PCB Board in conjunction with lead free solder paste alloys known in the art as SAC305 (Sn96.5/Ag3.0/Cu0.5) or SN100C (Sn99.2/Cu0.7/Ni0.05/Ge0.009) and/or any combination of the foregoing. Additionally or alternatively, the lead free solder column disclosed herein can be reflowed to conductive pads on an LGA/CGA substrate and/or PCB board with other available lead free solder paste alloys including or consisting of any combination of tin (Sn) approximately over 96% by weight, silver (Ag) less than approximately 5% by weight, copper (Cu) less than approximately 3% by weight, and alternatively other additives or dopants such as nickel (Ni), germanium (Ge), gallium (Ga), bismuth (Bi), indium (In), antimony (Sb) or palladium (Pd).

Furthermore, any lead bearing solder column embodiments disclosed herein can optionally be reflowed to the conductive pads on an LGA/CGA substrate and/or PCB board with any available combination of alloys of lead (Pb) shown in FIG. 8, which can, optionally, be less than 40% by weight, and tin (Sn), which can, optionally, include the remainder (balance) of the material by weight. Non-limiting examples include Sn63/Pb37 or Sn62/Pb36/Ag2 with approximately 2% silver (Ag), and other similar materials or alloys.

Any embodiments disclosed herein can include any combination of the foregoing methods, devices, components, materials, and any other details of the foregoing embodiments or aspects of the embodiments.

While certain arrangements of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A solder column, comprising:
an inner core comprising a conductive metallic material and having an outer surface;
an outer sleeve surrounding a portion of the outer surface of the inner core and comprising a solder material;
at least one space along a length of the outer sleeve wherein the outer surface of the inner core is not covered by the outer sleeve; and
a second layer comprising a solder material coupled with a portion of the outer surface of the inner core within the at least one space;
wherein:
the inner core is configured to support the solder column in at least an axial direction of the solder column so as to prevent a collapse of the solder column at temperatures above a liquidus temperature of the solder material of the outer sleeve and the solder material of the second layer.

2. The solder column of claim 1, wherein a melting point of the inner core is greater than the liquidus temperature of the solder material of the outer sleeve and the solder material of the second layer.

3. The solder column of claim 1, wherein the inner core is configured to not collapse at temperatures above the liquidus temperature of the solder material of the outer sleeve and the solder material of the second layer.

4. The solder column of claim 1, wherein the inner core is made from a wire material.

5. The solder column of claim 1, wherein the inner core is further configured to improve a conduction of heat through the solder column.

6. The solder column of claim 1, wherein the inner core comprises at least one of copper, gold, silver, tin, platinum, palladium or beryllium-copper.

7. The solder column of claim 1, wherein the at least one space extends along an entire length of the inner core.

8. The solder column of claim 1, wherein the at least one space extends helically around the outer surface of the inner core along an entire length of the inner core.

9. The solder column of claim 1, wherein the at least one space comprises a plurality of spaces along a length of the outer sleeve.

10. The solder column of claim 1, wherein the at least one space is configured to provide additional flexibility to the solder column to improve the ability of the solder column to absorb stresses caused by mismatches in the coefficient of thermal expansion between the substrates interconnected by the solder column.

11. The solder column of claim 1, wherein the inner core does not collapse during reflow.

12. The solder column of claim 1, wherein the outer sleeve extends helically around the outer surface of the inner core at a pitch that provides for the at least one space along the length of the outer sleeve.

13. The solder column of claim 1, wherein the outer sleeve comprises at least one of a lead free alloy SCN305, a lead free alloy Sn96.5/Cu3.0/Ni0.5, a lead free alloy Sn96.5/Cu3.5, a lead free alloy Sn balance/Cu1.0-5.0/Ni0.1-2.0, a lead-bearing alloy Pb80/Sn20, a lead-bearing alloy Pb85/Sn15, a lead-bearing alloy Pb90/Sn10, a lead-bearing alloy Pb balance/Sn5-20, and a lead-bearing alloy Pb93.5/Sn5/Ag1.5.

14. The solder column of claim 1, wherein the second layer also covers at least a portion of an outer surface of the outer sleeve.

15. The solder column of claim 1, wherein the second layer comprises at least one of lead free alloy of Sn96.5/Ag3.0/Cu0.5, Sn balance/Cu0.6-0.8/Ag0.5-0.7/Bi1.8-2.0, Sn balance/Cu0.6-0.8/Ag2.8-2.9/Bi2.5-2.9/Sb0.5-0.7/Ni0.04-0.06, Sn balance/Ag3.5/Bi0.5/In8.0, Sn balance/Ag3.5/Bi0.5/In4.0, Sn balance/Cu0.7/Ni0.05/Ge<0.010, Sn100C, lead-bearing alloy of Sn63/Pb37, Sn62/Pb36/Ag2, or Pb balance/Sn5-20.

16. The solder column of claim 1, wherein the solder column is lead free.

17. The solder column of claim 1, wherein the solder column is configured such that the solder column material will form a bond with conductive pads of an LGA/CGA and/or a printed circuit board without the solder column collapsing when the sleeve structure material is in a plastic molten state.

18. A solder column for mounting electronic components to a printed circuit board, comprising:
an inner core comprising a first material having a first liquidus temperature;
an outer sleeve surrounding at least a majority of an outer surface of the inner core, the outer sleeve comprising a second material having a second liquidus temperature; and
a plurality of spaces along a length of at least one side of the inner core between segments of the outer sleeve;
wherein:
the solder column is configured such that the inner core will support the outer sleeve and prevent a collapse of the outer sleeve at temperatures above a liquidus temperature of the outer sleeve; and
the spaces are configured to provide additional flexibility to the solder column to improve the ability of the solder column to absorb stresses caused by mismatches in a coefficient of thermal expansion between a first substrate coupled with a first end of the solder column and a second substrate coupled with a second end of the solder column.

19. The solder column of claim 18, further comprising a second layer comprising a solder material coupled with a portion of the outer surface of the inner core within the plurality of spaces.

20. The solder column of claim 18, wherein the outer sleeve extends helically along at least a substantial portion of the length of the inner core.

* * * * *